(12) United States Patent
Mohindra

(10) Patent No.: US 7,899,424 B2
(45) Date of Patent: *Mar. 1, 2011

(54) TRANSMITTER POWER AMPLIFIER RAMPING METHOD

(75) Inventor: Rishi Mohindra, Milpitas, CA (US)

(73) Assignee: ST-Ericsson SA, Plan-les-Ouates (CH)

( * ) Notice: Subject to any disclaimer, the term of this patent is extended or adjusted under 35 U.S.C. 154(b) by 832 days.

This patent is subject to a terminal disclaimer.

(21) Appl. No.: 11/536,312

(22) Filed: Sep. 28, 2006

(65) Prior Publication Data

US 2007/0190949 A1    Aug. 16, 2007

Related U.S. Application Data

(62) Division of application No. 09/469,887, filed on Dec. 22, 1999, now Pat. No. 7,130,595.

(51) Int. Cl.
*H04B 1/06* (2006.01)
(52) U.S. Cl. ............ 455/260; 455/240.1; 455/334; 375/345
(58) Field of Classification Search .... 455/127.1–127.5, 455/205–210, 293, 341, 114.3, 115.1, 63.1, 455/63.2, 63.3, 67.13, 67.14, 240.1, 250–260, 455/323, 334; 375/297, 345
See application file for complete search history.

(56) References Cited

U.S. PATENT DOCUMENTS

| | | | |
|---|---|---|---|
| 4,739,321 A * | 4/1988 | Friedman et al. | 370/445 |
| 5,694,417 A | 12/1997 | Andren et al. | |
| 5,697,073 A | 12/1997 | Daniel et al. | |
| 5,712,870 A * | 1/1998 | Petrick | 375/147 |
| 5,867,065 A | 2/1999 | Leyendecker | |
| 5,923,712 A | 7/1999 | Leyendecker et al. | |
| 5,990,734 A | 11/1999 | Wright et al. | |
| 5,999,830 A | 12/1999 | Taniguchi et al. | 455/574 |
| 6,141,390 A | 10/2000 | Cova | |

FOREIGN PATENT DOCUMENTS

| | | |
|---|---|---|
| EP | 0800267 | 10/1997 |
| EP | 0800267 A2 | 10/1997 |
| JP | 06152553 | 5/1994 |
| JP | 09275424 | 10/1997 |
| JP | 10093495 | 4/1998 |
| JP | 11511609 | 10/1999 |
| WO | 97/08824 | 3/1997 |

* cited by examiner

*Primary Examiner* — Nhan Le

(74) *Attorney, Agent, or Firm* — Thomas J. Satagaj; Seed IP Law Group PLLC

(57) ABSTRACT

A method for reducing frequency glitches in a digital transceiver due to power amplifier input impedance variations. According to the method, the power amplifier is switched on after the end of a prior packet reception period and before a new packet transmission begins. Instead of ramping the power amplifier gain, the method ramps the modulation signals. As a consequence, any VCO frequency transients that may result from turning on the power amplifier have an opportunity to decay before the new packet transmission is initiated. This technique effectively isolates the transmitter power amplifier from the frequency synthesizer VCO to facilitate fast switching transceiver operation.

20 Claims, 3 Drawing Sheets

TRANSMITTER POWER AMPLIFIER RAMPING METHOD

RELATED APPLICATIONS

This application is a divisional of U.S. patent application Ser. No. 09/469,887, filed on Dec. 22, 1999, now U.S. Pat. No. 7,130,595, and claims the benefit thereof. The contents of U.S. patent application Ser. No. 09/469,887, now U.S. Pat. No. 7,130,595, is incorporated herein by reference.

BACKGROUND OF THE INVENTION

1. Technical Field

The present invention relates generally to the field of communication electronics and, in particular, to a method for reducing frequency glitches during ramping of a power amplifier in a digital transceiver.

2. Description of the Related Art

Spread spectrum is a communication technique that has found widespread use for both military and commercial applications. In a spread spectrum communication system, the transmitted modulation is spread (i.e., increased) in bandwidth prior to transmission over the channel and then despread (i.e., decreased) in bandwidth by the same amount at the receiver.

One of the target applications for spread spectrum is to facilitate wireless or radio communications between separated electronic devices. For example, a wireless local area network (WLAN) is a flexible data communication system that uses radio technology to transmit and receive data over the air, thereby reducing or minimizing the need for wired connections. In a typical WLAN, an access point is provided by a transceiver that connects a wired network from a fixed location. End users connect to the WLAN through transceivers that are typically implemented as PC cards in a laptop computer, or ISA or PCI cards for desktop computers. The transceiver may also be integrated with any device, such as a handheld computer, personal digital assistant, or the like.

The majority of the WLAN products available in the marketplace today are proprietary spread spectrum solutions targeting vertical applications operating in the 900 MHz and 2.4 GHz ISM frequency bands. These products include, as mentioned above, wireless adapters and access points in PCM-CIA, ISA and custom PC board platforms. A typical spread spectrum transceiver comprises a conventional IF radio circuit, coupled to a baseband processor, which provides the desired modulation of the signal to be transmitted and the desired demodulation of a signal received at the transceiver. The IF radio circuit includes a frequency synthesizer that includes a voltage controlled oscillator (VCO) and a phase-locked loop (PLL). The baseband processor performs a given spread spectrum modulation technique such as direct sequence (DS) modulation, frequency hopping (FH) modulation, time hopping (TH) modulation, or hybrid modulations that blend together one or more of the various schemes.

The spread spectrum transceiver as described above typically operates in a time division duplex (TDD) mode of operation wherein the transmitter is switched on during packet transmission and switched off during packet reception. The transmitter includes a number of components including a power amplifier, and a pair of up-converter mixers. Typically, the transmitter power amplifier is only turned on when sending a data packet (or perhaps just before). The power amplifier is "ramped" on (as opposed to being hard-switched) to reduce spectral splatter, i.e., the leaking of RF signals into adjacent signal channels. Power ramping is achieved by adjusting (i.e., increasing) the gain of the power amplifier.

The frequency synthesizer, on the contrary, must remain on during both TDD signal transmission and reception. When the power amplifier is ramped, however, undesirable frequency variations are produced in the frequency synthesizer due to changes in the amplifier's input impedance. The phase-locked loop cannot instantaneously correct for these frequency variations. Moreover, as the frequency error becomes large, a far end receiver cannot be synchronized properly to the transmitted signal.

In the prior art, this problem has sought to be addressed by isolating the transmitter power amplifier from the synthesizer VCO. FIG. 3 shows the additional isolation, namely the buffers 326 and 312, incorporated between the VCO 322 and the power amplifier 314. The buffers 326 and 312 are usually multistage sections in order to attain a high isolation as defined by $\circ S_{21r}/\circ S_{12r}$, $S_{12}$ being the forward gain (from point A to B) and $S_{21}$ being the reverse gain. FIG. 1 illustrates the isolation process, which involves switching on the transmitter components (other than the power amplifier) at the end of a reception period $R_x$ and then ramping the power amplifier at a later instant, usually upon transmission of a preamble that precedes the actual signal payload. As shown in FIG. 1, however, this operation still results in an undesirable VCO frequency transient (i.e., a glitch) when the power amplifier ramps on. Moreover, this isolation technique is not sufficient for fast switching transceivers that need to comply with IEEE 802.11 standards, which require frequency accuracy better than 25 ppm.

The present invention addresses this problem.

BRIEF SUMMARY OF THE INVENTION

According to the present invention, the transmitter power amplifier is switched on with other transmitter components after the end of a prior packet reception period and before a new packet transmission begins. Because the power amplifier is already on, the power "ramping" is accomplished by monotonically increasing the in-phase and quadrature-phase baseband modulation signals that are applied to the up-converter mixers. Thus, instead of ramping the power amplifier gain, the method ramps the modulation signals that are applied to the power amplifier. As a consequence, any VCO frequency transients that may result from turning on the power amplifier have an opportunity to decay before the new packet transmission is initiated. This technique effectively isolates the transmitter power amplifier from the frequency synthesizer VCO to facilitate fast switching transceiver operation.

The foregoing has outlined some of the more pertinent objects and features of the present invention. These objects and features should be construed to be merely illustrative of some of the more prominent features and applications of the invention. Many other beneficial results can be attained by applying the disclosed invention in a different manner or modifying the invention as will be described. Accordingly, other objects and a fuller understanding of the invention may be had by referring to the following Detailed Description.

BRIEF DESCRIPTION OF THE DRAWINGS

For a more complete understanding of the present invention and the advantages thereof, reference should be made to the following Detailed Description taken in connection with the accompanying drawings in which.

DETAILED DESCRIPTION OF THE PREFERRED EMBODIMENT

Figure 1:
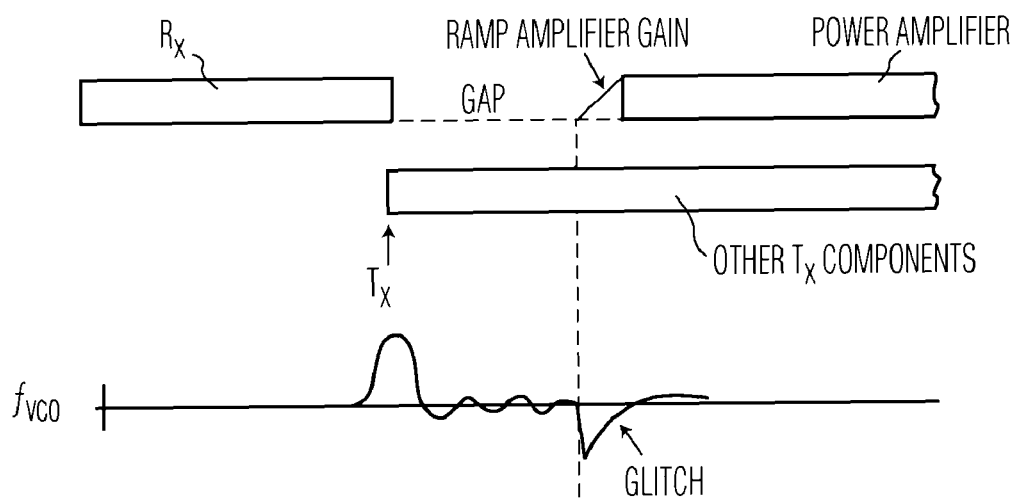
FIG. 1 is a simplified illustration of a prior art power amplifier ramping technique and the attendant VCO frequency glitch caused by power amplifier load impedance variations.
Figure 2:
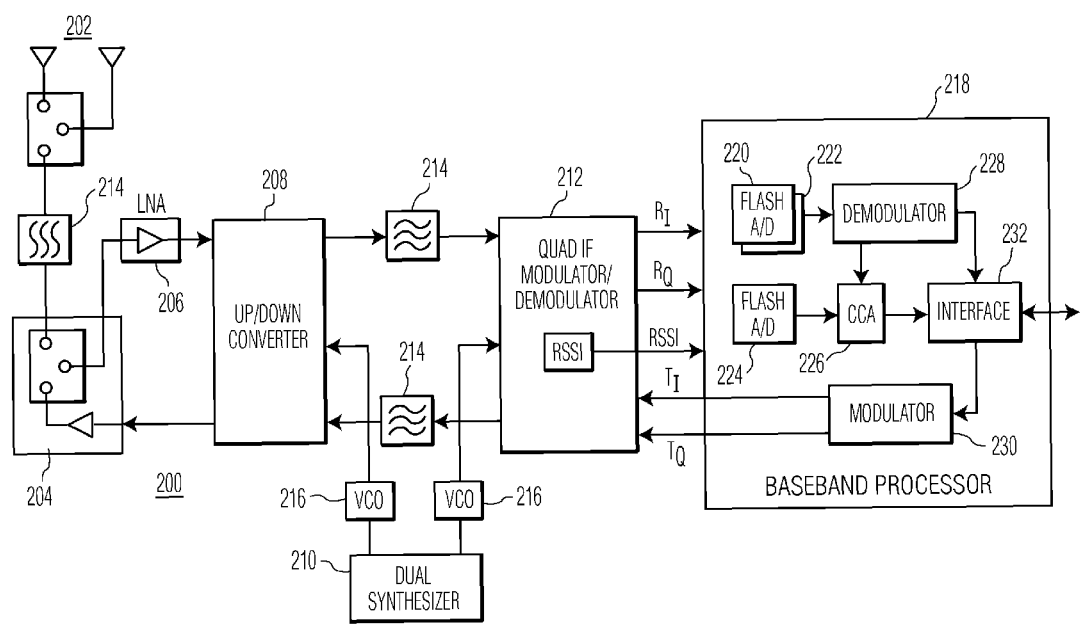
FIG. 2 is a block diagram of a known spread spectrum transceiver in which the present invention is implemented.

FIG. 2 illustrates a known wireless transceiver 200 in which the present invention may be implemented. The transceiver may be used for WLAN applications in the 2.4 GHz ISM band in accordance with the proposed IEEE 802.11 standard, although this is not a limitation of the present invention. The transceiver comprises selectable antennas 202 coupled to a RF power amplifier and transmit/receive switch 204. A low noise amplifier 206 is also operatively coupled to the antennas. The transceiver also includes an up/down converter 208 connected to both the low noise amplifier 206 and the RF power amplifier and transmit/receive switch 204. The up/down converter 208 is connected to a dual frequency synthesizer 210 and a quadrature IF modulator/demodulator 212. IF modulator/demodulator 212 includes a received signal strength indicator (RSSI) function for providing an RSSI monitoring or "sniffing" function, as is well-known. One or more filters 214 and voltage controlled oscillators (VCOs) 216 may also be provided. The above components comprise a conventional radio portion of the spread spectrum transceiver. Familiarity with the operation of such components is presumed.

A spread spectrum baseband processor 218 is coupled to the radio portion and contains all of the functions necessary to facilitate full or half duplex packet-based spread spectrum communications as is also well-known in the art. In particular, the processor has on-board dual, flash A/D converters 220 and 222 for receiving in-phase (I) and quadrature (Q) signals from the IF modulator 212. The baseband processor also includes another flash A/D converter 224 for processing the received signal strength indicator (RSSI) voltage from the IF modulator 212. A clear channel assessment (CCA) circuit 226 provides a clear channel assessment function to avoid data collisions and to optimize network throughput. The flash A/D converter outputs are supplied to the demodulator 228, which despreads the received signal. The modulator 230 performs the spreading function, as is well understood. An interface circuit 232 is connected to the both the demodulator 228 and the modulator 230 to interface the data to/from the baseband processor. Again, all of the above components are well-known to one of ordinary skill in the art.

One type of spread spectrum technique is direct sequence modulation. For illustration purposes, the present invention will be described in the context of a direct sequence baseband processor, although this is not a limitation of the invention as will be seen. A direct sequence modulation is formed by linearly modulating an output sequence of a pseudorandom number (PN) generator onto a train of pulses, each having a duration called the chip time. An 11 bit Barker sequence (i.e., +++---+--+-) may be used for this purpose. The use of an 11 bit Barker sequence, of course, is merely exemplary. A Barker sequence is a binary $\{-1, +1\}$ sequence $\{s(t)\}$ of length n having aperiodic autocorrelation values $|\rho_s(\tau)|<1$ for all $\tau$, $-(n-1)<\tau<n-1$. Typically, this type of modulation is used with binary phase-shift-keyed (BPSK) information signals. A direct sequence BPSK signal is generated by multiplying the BPSK signal by the direct sequence modulation. To demodulate a received BPSK signal, a local PN random generator (which generates the PN waveform at the receiver used for despreading) must be synchronized to within one chip of the PN waveform of the received BPSK signal. This function is done by a search routine that steps the local PN waveform sequentially in time by a fraction of a chip and, at each position, searches for a high degree of correlation between the received and local PN reference waveforms. The search ends when the correlation exceeds a given threshold, which is an indication that a coarse alignment has been achieved. After bringing the two PN waveforms into coarse alignment, a delay-locked or tau-dither tracking loop is used to maintain a fine alignment. Further details of this process are described, for example, in *The Communications Handbook,* 16.4 (1997), CRC Press, which is incorporated herein by reference.

Figure 3:
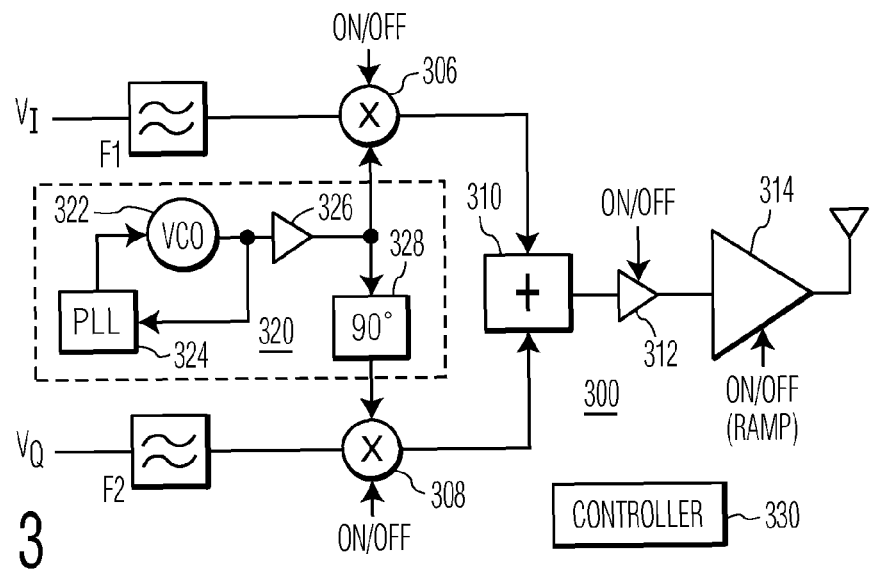
FIG. 3 is a simplified block diagram of a transmitter portion of the spread spectrum transceiver of FIG. 2 illustrating the basic components of the power amplifier circuitry.

Referring now to FIG. 3, the conventional power amplifier circuitry 300 of a transmitter of a spread spectrum transceiver is shown. A representative transceiver is a Philips Model SA2400 2.46 HZ Direct Conversion Zero IF Transceiver, although the invention may be implemented in any transceiver or transmitter that uses power ramping. The power amplifier circuitry comprises a pair (F1, F2) of channel filters 302 and 304, in-phase and quadrature-phase up-converter mixers 306 and 308, a summer 310, a buffer amplifier 312, and a power amplifier 314. The frequency synthesizer 320 comprises a voltage controlled oscillator 322, a phase-locked loop (PLL) 324, a buffer 326, and a phase shifter 328. Typically, the power amplifier 314 is turned off except during (or just before) packet transmission. The frequency synthesizer remains on, however, as it is used in both packet transmission and reception, for instance, in a time division duplex (TDD) transceiver. As is also well-known, to avoid spectral splatter, the power amplifier 314 is ramped, as opposed to being hard-switched, when it becomes necessary to initiate or terminate a packet transmission. In the prior art, however, ramping was accomplished by increasing or decreasing the amplifier gain, typically when the packet preamble began or ended. As the amplifier was switched on, however, its input impedance varied, which caused frequency variations in the frequency synthesizer 320, The PLL 324 cannot instantaneously correct these frequency variations.

To overcome this problem, the present invention implements a novel power ramping control method. According to the method, the power amplifier 314 is switched on after the end of a prior packet reception period and before a new packet transmission begins. Instead of ramping the power amplifier gain, the method ramps the baseband modulation signals that are supplied to the up-converter mixers. As a consequence, any VCO frequency transients that may result from turning on the power amplifier have an opportunity to decay before the new packet transmission is initiated. This technique fully isolates the transmitter power amplifier from the frequency synthesizer VCO.

In a preferred embodiment, the power amplifier is switched on sufficiently early so that any disturbance in the VCO frequency has settled down before the next packet transmission is initiated. In a particularly preferred embodiment, the power amplifier is turned on as soon as possible following receipt of a packet by the receiver portion. As is well-known, there are many techniques for determining when a receive packet period has ended. Thus, for example, the end of a packet reception period may be determined by looking for the end of a transmission burst, looking for a CRC code, by examining a frame delimiter in a data field, by calculating the reception period using length data in a frame header, or the like. Any convenient technique may be used, as the inventive method is designed to be backwards-compatible with existing transceiver circuitry.

Figure 4:
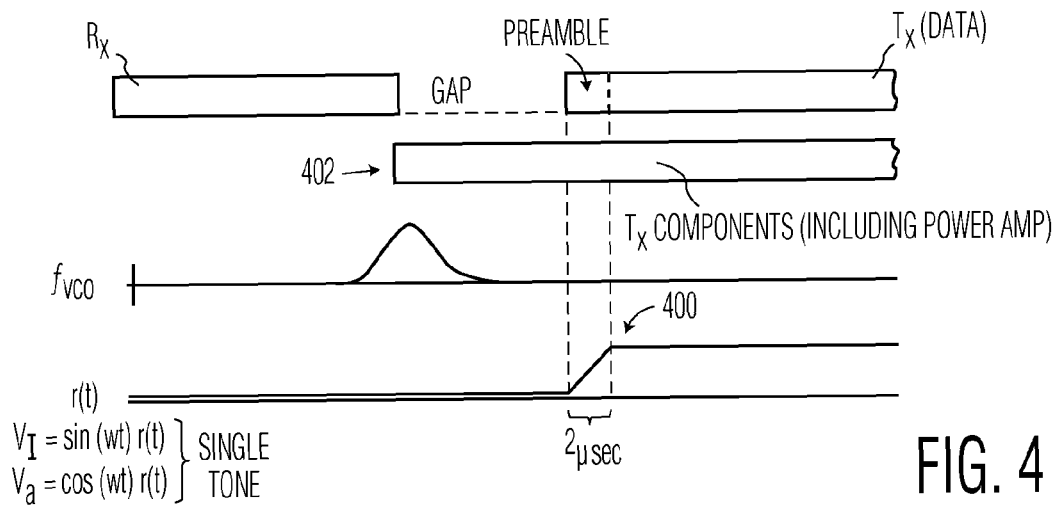
FIG. 4 is an illustration of the inventive power amplifier ramping technique of the present invention.

Once the receiver identifies the end of the packet reception (or whenever the signal has to be transmitted) and the power amplifier is turned on in advance, the transmitter waits for initiation of a new packet transmission. Typically, there is an enforced delay between the end of a receive packet and the start of a new packet transmission. When the new packet transmission begins, or just shortly before (during the packet preamble), the in-phase and quadrature-phase baseband signals supplied to the up-converter mixers 306 and 308 are ramped. In a preferred embodiment, ramping is accomplished by simple linear scaling of the digital words as those words are output from the baseband processor. FIG. 4 illustrates the resulting operation. In this example, preferably the baseband signals are ramped 400 beginning with the packet preamble, with the ramping lasting about 2 microseconds. The preamble typically is much longer than the ramping duration. As can be seen, the early turn-on 402 of the power amplifier results in a frequency variation in the VCO output, however, this output has already died down by the time the $V_I$ and $V_Q$ baseband signals are ramped. As a result, there is no frequency glitch or transient when the actual signal transmission begins. This control method thus provides significant advantages as compared to the prior art power amplifier ramping techniques.

Figure 5:
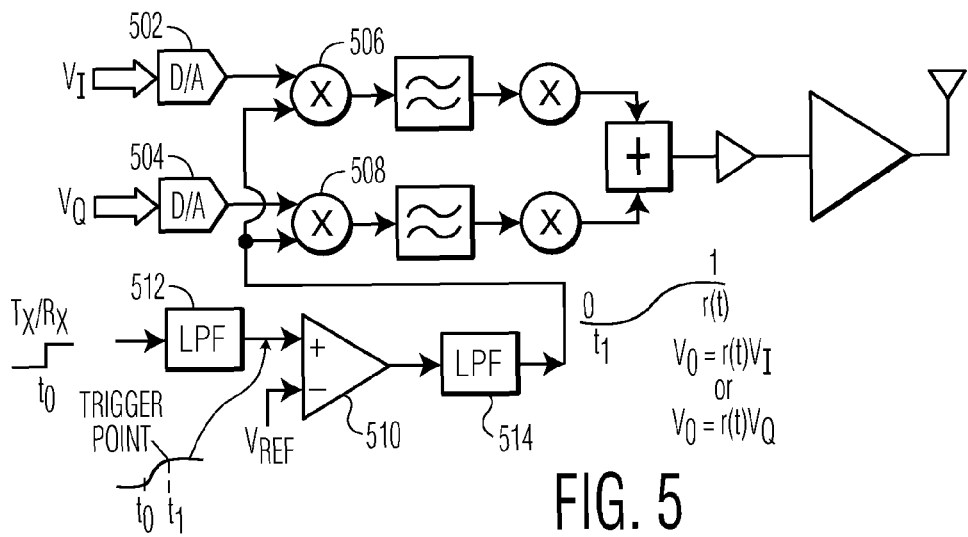
FIG. 5 is an alternate embodiment of the present invention wherein the inventive power ramping technique is used in an analog transmitter circuit.

In the method described above, no changes are required to the conventional transmitter or frequency synthesizer circuitry. The control signals necessary to provide the inventive functionality may be generated in any convenient manner, e.g., a software-driven processor, a microcontroller, a finite state machine, in hardwired logic, an application specific integrated circuit (ASIC), a field programmable gate array (FPGA), or the like. While the digital implementation is preferred, one of ordinary skill in the art will appreciate that the ramping signal may be analog. FIG. 5 illustrates such an alternate embodiment.

In FIG. 5, the digital words output from the baseband processor are first converted to analog signals by digital-to-analog converters 502 and 504, with the resulting outputs then ramped using a pair of multipliers 506 and 508. The multipliers are connected to the I and Q inputs and are supplied with a power ramping signal r(t). The analog ramping signal r(t) may be generated as follows. Upon toggling of the Tx/Rx pin (at $t=t_0$), a comparator 510 is triggered at $t=t_1$ through a first low pass filter 512. A second low pass filter 514, controlled by the comparator 510, controls each multiplier.

In the examples given, power ramping-up has been described. The same principles for ramping up apply to power ramping down, by ramping the modulation signal.

Having thus described my invention, what I claim as new is set forth in the following claims.

The invention claimed is:

1. A transceiver, comprising:
   a receiver;
   a transmitter including a power amplifier, and a pair of up-converter mixers;
   a frequency synthesizer including a voltage controlled oscillator (VCO);
   a controller for isolating the power amplifier and the VCO, comprising:
     means for switching on the power amplifier after an end of a prior packet reception period, and
     means for ramping modulation signals supplied to the up-converter mixers upon initiation of a new packet transmission.

2. The transceiver as described in claim 1 wherein the modulation signals are in-phase and quadrature-phase modulation signals.

3. The transceiver as described in claim 2 wherein the ramping means monotonically scales a set of digital words representing the in-phase and quadrature-phase signals.

4. The transceiver as described in claim 2 wherein the ramping means includes:
   means for generating an analog ramping signal; and
   means for applying the analog ramping signal to the in-phase and quadrature-phase baseband signals.

5. The transceiver as described in claim 4 wherein the means for applying is a multiplier.

6. The transceiver as described in claim 1 that is compliant with the IEEE 802.11 standard.

7. A transceiver for use in a wireless local area network (WLAN), comprising:
   a radio circuit including a power amplifier, a pair of up-converter mixers, and a frequency synthesizer;
   a processor coupled to the radio circuit and including means for generating modulation signals that are supplied to the up-converter mixers; and
   a controller for switching on the power amplifier at an end of a prior packet reception period and for ramping the modulation signals supplied to the up-converter mixers upon initiation of a new packet transmission.

8. The transceiver as described in claim 7 wherein the controller monotonically scales a set of digital words representing modulation signals.

9. The transceiver as described in claim 7 wherein the controller includes:
   means for generating an analog ramping signal; and
   means for applying the analog ramping signal to the modulation signals.

10. A transceiver, comprising:
    a receiver;
    a transmitter including a power amplifier, and a pair of up-converting mixers;
    a frequency synthesizer including a voltage controlled oscillator;
    a controller for isolating the power amplifier in advance of packet transmission; and
    means for ramping modulation signals supplied to the up-converter mixers upon initiation of a new packet transmission.

11. A transceiver as described in claim 10, further comprising means for ramping down signals at the end of packet transmission.

12. A transceiver, comprising:
    a receiver;
    a transmitter having a power amplifier, a first up-converter mixer, and a second up-converter mixer;
    a frequency synthesizer having a voltage controlled oscillator (VCO);
    a controller operable to isolate the power amplifier from the VCO, the controller including:
      a switch operable to switch on the power amplifier after an end of a prior packet reception period, and
      a ramping circuit operable to ramp a first modulation signal supplied to the first up-converter mixer and further operable to ramp a second modulation signal supplied to the second up-converter mixer upon initiation of a new packet transmission.

13. The transceiver of claim 12, further comprising:
a modulation signal generating circuit operable to generate in-phase and quadrature-phase modulation signals.

14. The transceiver of claim 12 wherein the ramping circuit is further operable to monotonically scale a set of digital words representing in-phase and quadrature-phase signals.

15. The transceiver of claim 12 wherein the ramping circuit includes:
a generating circuit operable to form an analog ramping signal; and
a multiplier circuit operable to apply the analog ramping signal to in-phase and quadrature-phase baseband signals.

16. A method of operating a transceiver, comprising:
determining that a packet is to be transmitted;
operating a power amplifier after determining that the packet is to be transmitted;
ramping baseband in-phase and quadrature-phase modulation signals;
supplying the ramped baseband in-phase and quadrature-phase modulation signals to respective up-converter mixers.

17. The method of claim 16 wherein determining the packet is to be transmitted includes determining completion of a packet reception period and operating the power amplifier after determining that the packet is to be transmitted includes switching on the power amplifier after the completion of the packet reception period.

18. The method of claim 17 wherein determining completion of the packet reception period includes identifying a field in a received packet and analyzing the contents of the field.

19. The method of claim 16 wherein ramping baseband in-phase and quadrature-phase modulation signals includes monotonically scaling a set of digital words representing the baseband in-phase and quadrature-phase modulation signals.

20. The method of claim 16 wherein ramping baseband in-phase and quadrature-phase modulation signals includes generating circuit an analog ramping signal and multiplying the in-phase and quadrature-phase baseband signals by the analog ramping signal.

* * * * *